United States Patent [19]

Schell

[11] 4,019,803
[45] Apr. 26, 1977

[54] SOLDER SUBSTRATE CLIP
[75] Inventor: Mark Samuel Schell, New Cumberland, Pa.
[73] Assignee: E. I. Du Pont de Nemours and Company, Wilmington, Del.
[22] Filed: Oct. 15, 1975
[21] Appl. No.: 622,747
[52] U.S. Cl. .......................................... 339/275 B
[51] Int. Cl.² .......................................... H01R 9/06
[58] Field of Search ........... 339/17, 275; 29/191.6, 29/193.5; 174/52 FP, 94 R

[56] References Cited
UNITED STATES PATENTS

| | | | |
|---|---|---|---|
| 3,351,704 | 11/1967 | Sitzler | 174/84 |
| 3,750,252 | 8/1973 | Landman | 29/191.6 |
| 3,750,265 | 8/1973 | Cushman | 29/471.3 |
| 3,889,364 | 6/1975 | Krueger | 29/628 |
| 3,953,102 | 4/1976 | Rivetta et al. | 339/275 R |

*Primary Examiner*—Joseph H. McGlynn

[57] ABSTRACT

A solder substrate clip having a contact arm, a mass of solder secured to the arm on a side away from a contact surface and a solder globule integral with the mass of solder at an edge of the arm extending from the mass across the edge of the arm to the contact surface for engagement with a contact pad on the substrate.

14 Claims, 5 Drawing Figures

SOLDER SUBSTRATE CLIP

This application relates to an improved solder substrate clip of the type which carries an integral mass of solder so that after the clip has been positioned on a contact pad, typically a metal surface on a substrate moved into the mouth of the clip, and heated, the molten solder from the mass flows to and along the pad and cools, forming a soldered metallurgical joint between the contact surface and the pad. Clips of this type are disclosed in U.S. Pat. Nos. 3,351,704 and 3,750,252. In these patents a mass of solder is secured to an arm of the clip on the side thereof away from the contact surface. The mass does not extend across the edge of the arms. Upon heating and melting of the mass the molten solder must establish a flow path across the sheared rough edge of the clip in order to reach the contact interface, flow along that interface and form the desired solder joint. The molten solder does not readily flow across the edges of the arm with the result that in some situations the desired solder joint may not be formed.

The solder substrate clip according to the present invention includes a mass of solder secured to the side of the contact arm away from the substrate-receiving opening of the clip with an integral rounded solder globule extending from the solder mass across the thickness of the arm at an edge of the arm so that when the substrate is moved into the opening of the clip both the contact surface on the arm and the solder globule, or globules in the case that a globule is formed on each side of the arm, are brought into intimate wiping contact with the contact pad on the substrate. Upon melting of the solder mass and the solder in the globule, the solder in the globule adheres to and flows along the pad and forms a solder bridge connecting the pad to the mass of molten solder. The molten solder flows along the bridge past the sheared uncoated edge of the arm, thus assuring that the desired solder connection is formed between the arm and the pad on the substrate.

By providing a mass of solder remote from the contact area, it is possible to move the contact area of the arm into intimate wiped connection with the pad to which it is to be soldered so that it is in position to be soldered. During heating and flowing of the solder from the remote position of the solder mass on the back of the contact arm across the solder bridge provided by the globule and onto the contact pad, the arm is not moved, thereby reducing the possibility of forming an undesirable "cold" solder joint where there is movement at the joint during cooling of the molten solder. Such "cold" joints are experienced where a mass of solder is provided on a member and a second member to be soldered to the first member is positioned on top of the mass of solder and is moved with melting of the sandwiched solder mass.

Other objects and features of the invention will become apparent as the description proceeds, especially when taken in conjunction with the accompanying drawings illustrating the invention, of which there is one sheet.

Figure 1:
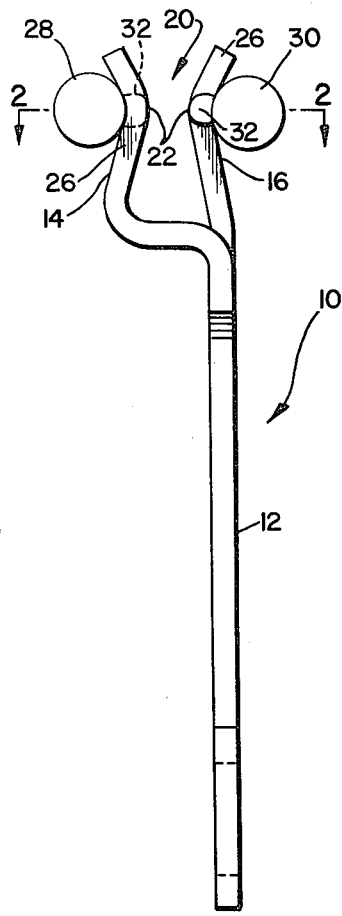
FIG. 1 is a side view of a solder substrate clip according to the invention.
Figure 2:
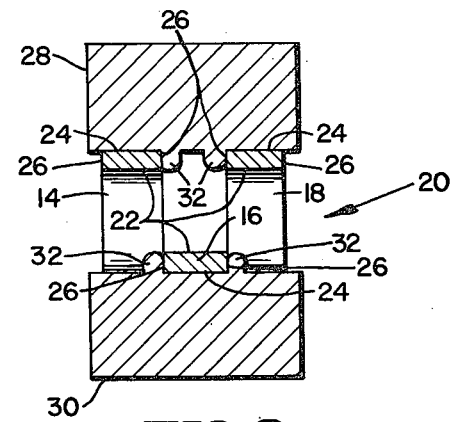
FIG. 2 is a sectional view taken along line 2—2 of FIG. 1.

Solder substrate clip 10 is preferably stamp-formed from relatively thin solder coated sheet metal stock and includes a tail or mounting portion 12 extending away from three substrate-engaging arms 14, 16, and 18. The arms are at one end of the clip with arm 16 located between and to one side of arms 14 and 18 to define a substrate or support receiving opening 20. Each arm includes a contact surface 22 located on a crest facing the opening 20 and a solder mounting surface 24 extending along a valley on the side of the arm away from the contact surface. The valleys and crests are formed by bends at the ends of the arms. Sheared edges 26 on the sides of the arms extend between the contact and solder mounting surfaces. While the contact and solder mounting surfaces of the arms are preferably solder coated, the sheared edges 26 are not solder coated. The valleys and crests and their respective contact and solder-mounting surfaces extend between the edges 26 on opposite sides of each arm.

Each clip 10 includes a pair of solder masses 28 and 30 secured to the arms at the solder mounting surfaces 24 in the valleys. Solder mass 30 is secured to the solder mounting surface 24 of arm 16 and solder mass 28 is secured to the solder mounting surfaces of arms 14 and 18. In clip 10 the masses are held in place on the solder mounting surfaces by metallurgical solder bonds between the masses and the arms. In some situations, the masses may be held in place by other means such as clips as illustrated in U.S. Pat. No. 3,750,252 or by tabs as illustrated in U.S. Pat. No. 3,351,704.

Rounded solder globules 32 integral with the masses, project from the masses adjacent edges 26 and extend across the thickness of the arms to the level of contact surfaces 22, thus bridging the distance between the masses and the contact surfaces at clip opening 20. Two globules extend from solder mass 28 along the adjacent edges 26 of arms 14 and 18 to the level of contact 22 thereof. A pair of solder globules extend from solder mass 30 at either side of arm 16 along the edges of the arm to the level of the contact surface of the arm.

As illustrated, the solder masses may be cylindrical in shape with the axis of the cylinder extending along the length of the valleys in the contact arms. Cylindrical solder masses are easily located in the valleys during manufacture of the clip 10, an important feature due to the minature size of the masses and high rates at which clips are manufactured.

Each solder mass is secured to its arm or arms by holding the cylindrical mass against the mounting surface in the valleys and then providing sufficient energy at or adjacent to the mounting surface or interface to melt the solder in the mass at the surface without melting the remainder of the solder in the mass. The arm is also heated. It is believed that the force holding the solder mass in the valley flows the molten solder at the interface along the valley to an edge where the molten solder grows in the form of a rounded surface tension globule extending away from the solder mass along the edge to bridge the distance between the solder mass and the level of the contact surface. The molten solder globule is believed to be cooled by the remaining relatively large amount of solder in the solder mass which acts as a heat sink. In some cases, the globule may extend beyond the contact surface.

The amount of energy supplied to the interface between the solder mass and the arm is sufficient to melt the entire mass, in that way assuring that a relatively large mass of molten solder does not coat the contact surface of the arm. While molten solder does not readily flow across the raw uncoated edges, a relatively large amount of molten solder could flow across the edges and coat the contact surface. This is undesirable because when a substrate is moved into the mouth the arms are bent further apart than intended due to the thickness of the solder coating and may be overstressed. During soldering of the clip to the substrate, the thick layer of solder would be melted freeing the arms for undesired movement during the soldering operation. Overstressed arms may not be strong enough to engage the substrate tightly.

Following dissipation of the energy provided at the interface between the solder mass and the contact arm, the molten solder in the valley cools, preferably forming a metallurgical solder joint between the solder mass and the contact arm. In some applications such a joint may not be formed due to surface impurities on the surface of the solder mass or on the surface of the arm. In this event, the mass would be held in place on the arm by a clasp, tab, or other device, as previously described.

Because of the small size of the clips and solder masses, only a small amount of energy need be applied to the interface between the solder mass and the contact arm in order to melt sufficient solder for the formation of the globules. This energy may be provided in a number of ways. For instance, the arms may be heated sufficiently prior to being brought into contact with the solder masses or an electrical current may be flowed through the arms and solder masses to heat the solder at the interface by resistance.

Figure 4:
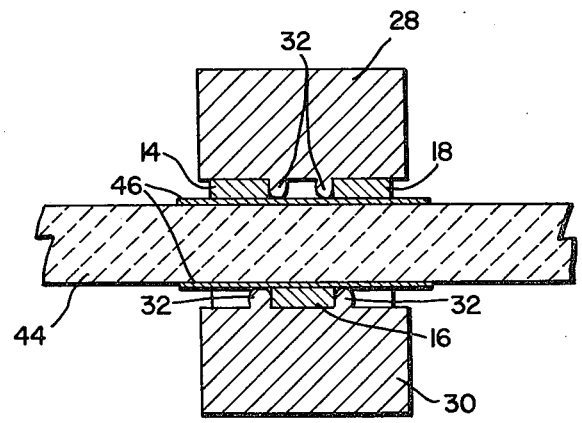
FIG. 4 is a sectional view taken along line 4—4 of FIG. 3.
Figure 3:
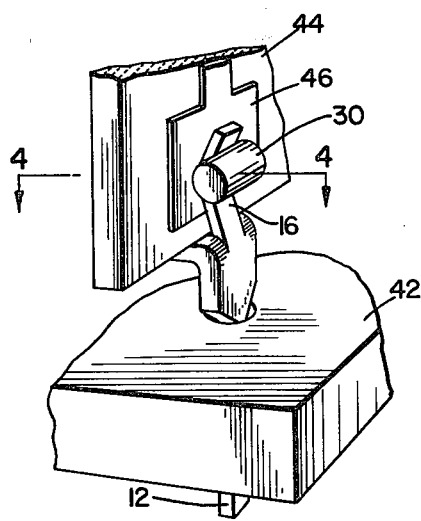
FIG. 3 is a perspective view of a clip as shown in FIGS. 1 and 2 mounted on a support and with one edge of a ceramic substrate positioned between the arms of the clip prior to soldering.
Figure 5:
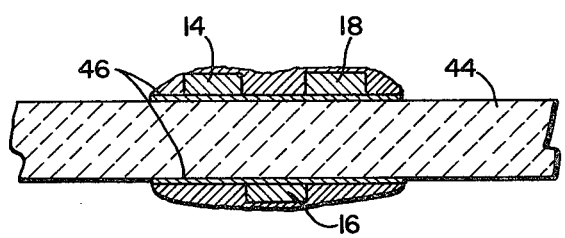
FIG. 5 is a view similar to FIG. 4 after soldering.

Substrate 44 or a similar support is moved into opening 20 of clip 10 so that the contact surfaces 22 on both sides of the opening are moved apart a slight distance and tightly engage metalized contact pads 46 on the substrate. As the substrate is moved into the opening, the contact surfaces and the ends of the globules 34 wipe across the pads 46, thereby establishing intimate connections between the pads and the contact surfaces and globules. FIG. 4 illustrates a substrate 44 positioned in the opening with the contact surfaces and the ends of the globules resting flush on the surfaces of pads 46. As illustrated, the globules are integral with the solder masses and form solid solder bridges extending from the masses across the thickness of the arms to the pads. The mounting tail 12 of clip 10 may extend into a support 42 and be connected to circuitry carried by the support.

The clip and substrate pads are then heated to a temperature sufficient to melt the solder in the masses and globules. When this occurs, the molten solder is drawn from the masses along the liquid solder bridges past the sheared uncoated edges 26 and onto the pads where a desired soldered connection is formed between the contact surfaces and the pads. During soldering, the contact surfaces rest flush upon the pads and the arms do not move relative to the pads. The globules assure that the molten solder flows from the side of the contact arm away from the substrate, across the thickness of the arm to the substrate pad, thus increasing the reliability of the resultant solder joint over those obtained through the use of conventional solder terminals where a mass of solder is secured to the side of a contact member or arm away from the surface to be soldered to a pad or contact without the use of a bridging solder globule improving the solder flow across the edge of the contact.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A terminal adapted to be soldered to a metal pad comprising a contact arm stamp-formed from thin sheet metal stock having a contact surface adapted to engage the pad, a solder-mounting surface on the other side of the arm from the contact surface and at least one sheared edge extending between said surfaces, a mass of solder metallurgically bonded to the solder-mounting surface and extending to one side of the mounting surface beyond the sheared edge, and a rounded solder globule projecting from the solder mass at the edge across the thickness of the contact substantially to or beyond the contact surface whereby, on positioning of the contact against the pad and melting of the solder mass, molten solder flows from the mass to the pad.

2. A terminal as in claim 1, said terminal having a pair of spaced contact arms with contact surfaces thereon facing each other, one of said arms carrying said mass of solder, and a mounting portion extending away from the arms.

3. A terminal as in claim 2 wherein the other contact arm includes a contact surface, a solder mounting surface and at least one sheared edge extending between its respective surfaces, a second mass of solder metallurgically bonded to the solder mounting surface of the other arm and extending to one side of such surface past the sheared edge of the other arm, and a second rounded solder globule projecting from the second solder mass at the edge of the other arm across the thickness of the arm substantially to or beyond the contact surface thereof whereby, on positioning a substrate or like member between the arms of the terminal so that the contact pads on the substrate engage the contact surfaces on the arms and melting of the solder, solder bridges extending from their respective solder masses to the pads facilitate the flow of molten solder to the pads.

4. A terminal as in claim 1 wherein the contact includes a second sheared edge extending between said surfaces, the mass of solder extends to the side of the mounting surface beyond the second sheared edge and a second rounded solder globule projects from the mass of solder at the second edge across the thickness of the contact substantially to or beyond the contact surface to provide a pair of solder bridges to facilitate the flow of molten solder to the pad.

5. A terminal as in claim 4, said terminal having a pair of like contact arms, said solder mass being secured to one of said arms, the other arm including a contact surface facing generally toward the first contact arm, a solder mounting surface facing generally away from the first contact arm and a sheared edge extending between such surfaces, a second mass of solder metallurgically bonded to the solder mounting surface of the other arm and a rounded solder globule projecting from such solder mass at such edge across the thickness of the arm substantially to or beyond the contact surface thereof.

6. A terminal as in claim 5, said terminal having a third contact arm located adjacent said other contact arm, said third arm including a contact surface and a solder mounting surface, said second mass of solder being metallurgically bonded to the solder mounting surfaces of both said other contact arm and said third contact arm, said third contact arm including a sheared edge extending between its solder mounting and contact surfaces, and a second rounded solder globule projecting from the second solder mass at the edge of the third contact arm across the thickness thereof substantially to or beyond the contact surface.

7. A terminal as in claim 6 wherein the edges of the other and third contact arms are adjacent to each other and are located across the clip from the edges of said one arm.

8. A terminal adapted to be soldered to a metal pad comprising a contact arm formed from metal stock having a contact surface on one side thereof, a solder mounting surface on the other side thereof and an edge extending between said surfaces, a mass of solder on the mounting surface extending to one side beyond the edge, wherein the improvement comprises a rounded solder globule projecting from the solder mass at the edge a distance across the thickness toward the contact surface whereby, upon positioning the contact surface on a pad and melting the solder mass and globule, the globule forms a solder bridge between the mass and the pad.

9. A terminal as in claim 8, including a metallurgical bond between the mass of solder and the solder mounting surface.

10. A terminal as in claim 8 wherein the arm includes a second edge, the solder mass extends beyond the second edge and including a second rounded solder globule projecting from the solder mass at the second edge a distance across the second edge toward the contact surface.

11. A terminal as in claim 8 wherein the contact surface is on a crest on the arm, the solder mounting surface is at the bottom of a valley on the arm opposite the crest and the globule extends from the valley to the crest.

12. A terminal as in claim 11, including a metallurgical bond securing the solder mass to the arm, said bond extending along the valley.

13. A terminal as in claim 1 wherein the contact includes a valley and a crest on opposite sides thereof, the edge extending across the valley and the crest, the contact surface lying on the crest and the solder mounting surface lying in the valley, and the globule extending between the valley and the crest.

14. A terminal as in claim 13 wherein the solder mass is generally cylindrical in shape and extends along the valley.

* * * * *